(12) United States Patent
Zonca

(10) Patent No.: US 7,253,108 B2
(45) Date of Patent: Aug. 7, 2007

(54) PROCESS FOR FORMING A THIN FILM OF TISIN, IN PARTICULAR FOR PHASE CHANGE MEMORY DEVICES

(75) Inventor: Romina Zonca, Milan (IT)

(73) Assignees: STMicroelectronics S.r.l., Agrate Brianza (IT); OVONYX, Inc., Boise, ID (US)

( * ) Notice: Subject to any disclaimer, the term of this patent is extended or adjusted under 35 U.S.C. 154(b) by 315 days.

(21) Appl. No.: 10/853,015

(22) Filed: May 25, 2004

(65) Prior Publication Data

US 2005/0006722 A1    Jan. 13, 2005

(30) Foreign Application Priority Data

May 26, 2003    (EP)    ................... 03425337

(51) Int. Cl.
*H01L 21/44*    (2006.01)

(52) U.S. Cl. ............... 438/683; 257/E21.302

(58) Field of Classification Search ........ 438/622, 438/683, 687
See application file for complete search history.

(56) References Cited

U.S. PATENT DOCUMENTS

| | | | | |
|---|---|---|---|---|
| 6,423,201 | B1 | 7/2002 | Mandrekar ............ | 205/186 |
| 6,576,543 | B2* | 6/2003 | Lin et al. ............. | 438/622 |
| 6,596,643 | B2* | 7/2003 | Chen et al. ............ | 438/706 |
| 2002/0114886 | A1* | 8/2002 | Chou et al. ........... | 427/255.391 |
| 2002/0168468 | A1 | 11/2002 | Chou et al. ........... | 427/255.27 |
| 2003/0036263 | A1 | 2/2003 | Lin et al. ............. | 438/638 |

FOREIGN PATENT DOCUMENTS

WO    WO 02/091437 A2    11/2002

OTHER PUBLICATIONS

Marcadal, C. et al. "Integration of Thin CVD TiSiN Barriers in CU Interconnects," Applied Materials Inc.
Marcadal, C. et al., "Metallorganic Chemical Vapor Deposited TiN Barrier Enhancement with $SiH_4$ Treatment," *Journal of the Electrochemical Society* 149(1):C52-C58, 2002.
Min, J-S. et al., "Metal-Organic Atomic Layer Deposition of Titanium-Silicon-Nitride Films," *Applied Physics Letters* 75(11):1521-1523, Sep. 1999.
Musaka, K. et al., "Thermal Stress and Reliability Characterization of Barriers for Cu Interconnects," *IEEE*, pp. 83-85, 2001.
de Felipe, T. et al., "Low Resistance Copper Interconnects with MOCVD TiN(Si) Barrier for Sub-0.13 μm Applications," Novellus Damascus—Technical Papers,.pp. 1-7, retrieved Jun. 5, 2002, from http://www.novellus.com/damascus/tec/tec_27.asp.

* cited by examiner

*Primary Examiner*—Scott B. Geyer
*Assistant Examiner*—Elias Ullah
(74) *Attorney, Agent, or Firm*—Lisa K. Jorgenson; Hai Han; Seed IP Law Group PLLC

(57) ABSTRACT

The process for forming a film of TiSiN includes the following sequence of steps: deposition of a TiN film at medium temperature, for example, 300-450° C., by thermal decomposition of a metallorganic precursor, for example TDMAT (Tetrakis Dimethylamino Titanium); exposition to a silicon releasing gas, such as silane ($SiH_4$) and dichlorosilane ($SiH_2Cl_2$) at 10-90 sccm—standard cube centimeters per minute—for a quite long time, for example, longer than 10 s but less than 90 s, preferably about 40 s; exposition to a $H_2/N_2$ plasma at 200-800 sccm, for 10-90 s, preferably about 40 s.

21 Claims, 2 Drawing Sheets

PROCESS FOR FORMING A THIN FILM OF TISIN, IN PARTICULAR FOR PHASE CHANGE MEMORY DEVICES

BACKGROUND OF THE INVENTION

1. Field of the Invention

The present invention relates to a process for forming a thin film of TiSiN, in particular for phase change memory devices.

2. Description of the Related Art

As is known, phase change memory devices utilize a class of materials that have the unique property of being reversibly switchable from one phase to another with measurable distinct electrical properties associated with each phase. For example, these materials may change between an amorphous disordered phase and a crystalline, or polycrystalline, ordered phase. A material property that may change and provide a signature for each phase is the material resistivity, which is considerably different in the two states and varies of two or more orders of magnitude when the material transforms from the amorphous phase (more resistive) to the crystalline phase (more conductive) and vice versa.

Phase change may be obtained by locally increasing the temperature. Under 150° C., both phases are stable. Over 200° C., nucleation of crystallites is fast and if the material is kept to the crystallization temperature for a sufficient time, it changes phase and becomes crystalline. In order to change the phase back to the amorphous state, its temperature is brought over the melting point (about 600° C.) and rapidly reduced.

From an electrical point of view; it is possible to reach both critical temperatures (crystallization and melting temperatures) by passing an electric current through a resistive electrode in contact or close proximity with the chalcogenic material and heating the material by Joule effect.

A chalcogenic element 1 based on the above is shown in FIG. 1, and comprises a resistive electrode 2 and a chalcogenic region 3. The chalcogenic region 3 is generally in the crystalline state to allow good current flow. A portion of the chalcogenic region 3 is in direct contact with the resistive electrode 2 and forms a phase change portion 4.

By passing an electrical current of suitable value through the resistive electrode 2, it is possible to selectively heat the phase change portion 4 to the crystallization or melting temperatures and cause a phase change.

The present requirements of low-energy devices impose some constraints to the program current of the device. In order to meet such requirements, the resistive electrode should comprise a film with the following features:

a) very low thickness (5-50 nm);

b) high conformity, to ensure the electrical continuity of the electrode;

c) medium resistivity (i.e., 0.5-5 mΩ·cm);

d) temperature stability.

The presently available processes are not able to ensure all the above features. Indeed, deposited films with similar characteristics to the above are deposited using a PVD (Physical Vapor Deposition) or a CVD (Chemical Vapor Deposition) technique.

However, films deposited by PVD are scarcely conformal due to the specific deposition technique and thus cannot ensure the electrical continuity.

Currently available CVD processes, in particular CVD processes developed to deposit TiSiN layers, are all optimized to form low-resistivity films, in particular to form barrier layers in interconnects, and thus are not compatible with the requirements.

For example, C. Marcadal, M. Eizenberg, A. Yoon, L. Chen "Metallorganic Chemical Vapor Deposited TiN Barrier Enhancement with $SiH_4$ Treatment" in Journal of The Electrochemical Society, 149 (1) C52-C58 (2002) discloses a commercial process using Metallorganic Chemical Vapor Deposition (MOCVD). In detail, this known process comprises three basic steps:

1. depositing a TiN film at medium temperature (350-450° C.) by thermal decomposition of a metallorganic precursor, namely TDMAT (Tetrakis Dimethylamino Titanium);

2. exposing the TiN film to $H_2/N_2$ plasma;

3. exposing the TiN film to a silane ($SiH_4$) flow for 10 s.

All the steps are carried out in the same reaction chamber.

The film obtained from the deposition in step 1 is very rich in carbon (30% atomic); carbon, present in the metallorganic precursor, causes the deposited film to be unstable when exposed to air (the film oxides and its resistivity increases in an uncontrollable way). The plasma treatment reduces the carbon content and at the same time thins the layer, so that the latter is less permeable to $O_2$ (a thickness reduction is indeed observed following the plasma treatment). The subsequent silane treatment causes addition of silicon to the film; however, in the final layer, the Si concentration is quite small (about 4.4 at%) since the reactive sites have been dramatically reduced by the plasma treatment. As used herein, at% refers to "atomic percentage", i.e., the ratio of the number of a specific atomic component in a composition relative to the total number of all the atoms of the composition.

Since in the literature the resistivity of the end film is attributed to the presence of Si—N covalent bonds, it is clear that the known process can yield only a low resistivity film, since here the Ti—N metal bond is predominating.

Another known process (see, e.g., "Low Resistance Copper Interconnects with MOCVD TiN(Si) Barrier for Sub-0.13 µm Applications", T. Suwwan de Felipe, et al., Novellus Systems and International SEMATECH) teaches the deposition of MOCVD TiNSi using TDEAT (Tetrakis Diethylamido Titanium) and ammonia and soaking in $SiH_4$ in-situ for forming a barrier for copper. Also here, the process is studied so as to reduce the resistivity of the barrier and thus is not suitable for forming a resistive layer, in particular for use in PCM devices.

BRIEF SUMMARY OF THE INVENTION

One embodiment of the invention provides a fabrication method affording higher resistivity levels for thin, high-conformal and thermally stable films of TiSiN, comprising the steps of depositing a TiN film and exposing the TiN film to a silicon-releasing gas to obtain a TiSiN film without previously exposing the TiN film to a carbon-reducing treatment.

Another embodiment of the present invention provides a TiSiN thin film having a resistivity higher than 0.6 mΩ·cm.

Yet another embodiment of the present invention provides a phase change memory device comprising a chalcogenic region and a resistive electrode in direct contact with the chalcogenic region, the resistive electrode having a TiSiN thin film of a resistivity higher than 0.6 mΩ·cm and Si content equals to or higher than 4.5 at%.

BRIEF DESCRIPTION OF THE SEVERAL VIEWS OF THE DRAWING(S)

For the understanding of the present invention, a preferred embodiment is now described, purely as a non-limitative example, with reference to the enclosed drawings, wherein.

DETAILED DESCRIPTION OF THE INVENTION

According to one embodiment of the invention, a film of TiSiN is obtained by the following sequence of steps:

1. depositing a TiN film at medium temperature (300-450° C.) by thermal decomposition of a metallorganic precursor, for example TDMAT (Tetrakis Dimethylamino Titanium);
2. exposing the film to a silicon releasing gas, such as silane ($SiH_4$) or dichlorosilane ($SiH_2Cl_2$) at 10-90 sccm (standard cubic centimeters per minute) for 10 to 90 seconds, preferably about 40 seconds);
3. exposing the film to a $H_2/N_2$ plasma at 200-800 sccm, for 10-90 seconds, preferably about 40 seconds.

All the steps are carried out in a same reaction chamber; in steps 2 and 3, the chuck is held at the same temperature as in step 1 (i.e., 300-450° C.). According to the above process, the carbon present in the TiN film deposited in step 1 and occupying the reactive sites, is partly eliminated and replaced by Si that can thus be incorporated at a higher concentration than in the known process. In fact, the original film is exposed to the silicon releasing gas without previously eliminating the reactive sites and thus remains in a reactive condition; thus the original film is capable of absorbing silicon in a greater extent than with the known process. Moreover the Si can also react with C forming Si—C bonds that together with Si—N bonds contribute to increasing the resistivity of the original film; as a matter of fact Si—C and Si—N are covalent bonds typical of dielectric compounds. Therefore, at the end of step 2, the resulting film has a medium-level resistivity, as confirmed by tests carried out by the applicant. The subsequent plasma treatment eliminates the remaining carbon and completes the densification process, thus ensuring the required stability.

The film thus obtained is highly conformal, chemically stable and has constant resistivity, once exposed to air. If the film is used for an application requiring stability with respect to temperature variance, as in the case of the manufacture of PCM cells, in order to increase temperature stability, it is possible to carry out an RTP (Rapid Thermal Process) annealing in an inert environment (Ar or $N_2$) at a medium temperature (600-800° C.). Moreover, it is possible to increase even more the resistivity of the original film to above the level that can be obtained through the deposition conditions, by carrying out an additional or a subsequent RTP annealing in an oxidizing environment ($O_2/N_2$) at a medium temperature (500-800° C.); the $O_2$ percentage can vary from 0.01% to 10% depending on the annealing temperature. The final film resistivity, after this treatment, can vary in the range of 1-10 mΩ·cm.

Figure 1:
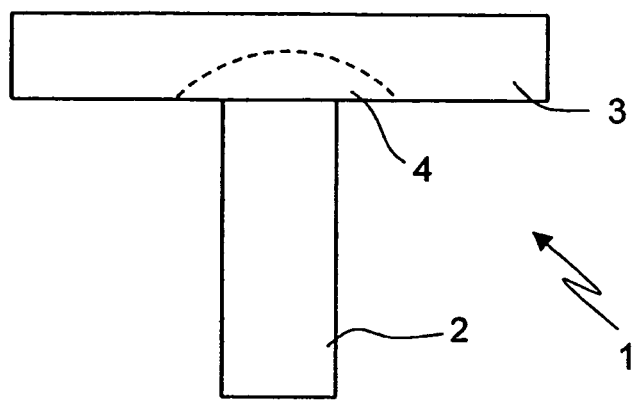
FIG. 1 shows the basic structure of a known chalcogenic element.
Figure 2:
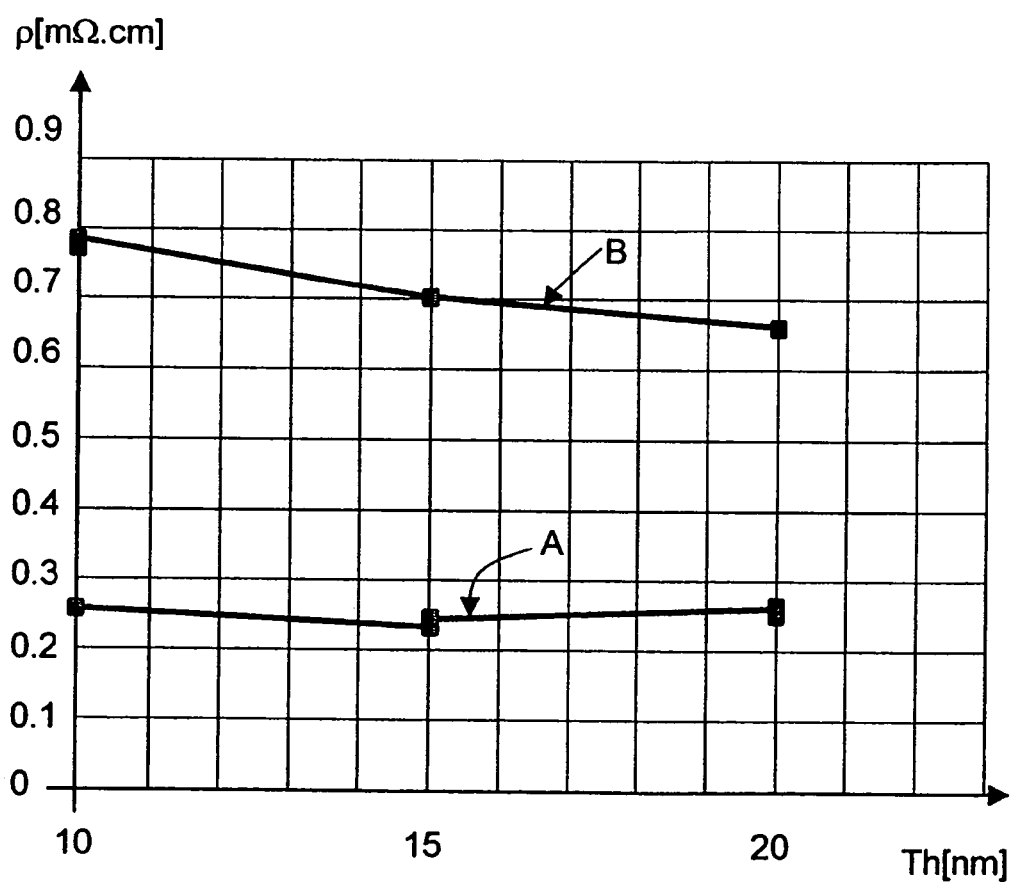
FIG. 2 shows the plot of the resistivity versus thickness for a film formed according to an embodiment of the invention and a film formed according to the prior art.

FIG. 2 shows the results of tests carried out by the applicant for a layer of TiSiN deposited according to the prior art method and a layer of TiSiN deposited according the above embodiment of the invention, with exposure to silane after deposition of TiN. In both cases, the final layers were derived from the superposition of thin layers of 5 nm, a complete cycle of plasma and silane treatment being performed for each thin layer.

In particular, in FIG. 2, curve A represents the resistivity of the prior art layer and curve B represents the resistivity of the layer manufactured according to the invention. As may be seen, curve B shows a resistivity 2-3 times higher than curve A and ranging between 0.67 mΩ·cm for a 20 nm thick layer to 0.77 mΩ·cm for a 10 nm thick layer. Thus a TiSiN layer deposited according to the method of the invention has a resistivity higher than 0.6 mΩ·cm.

Furthermore, in the characterization of the material, the samples of TiSiN layer obtained with the above described method show a much higher content of Si with respect to samples obtained with the prior MOCVD method according the prior art (content of Si comprised between 4.5 at% and 21 at% for the process of the present invention compared to a maximum content of Si of about 4 at% for prior art processes).

Figure 3:
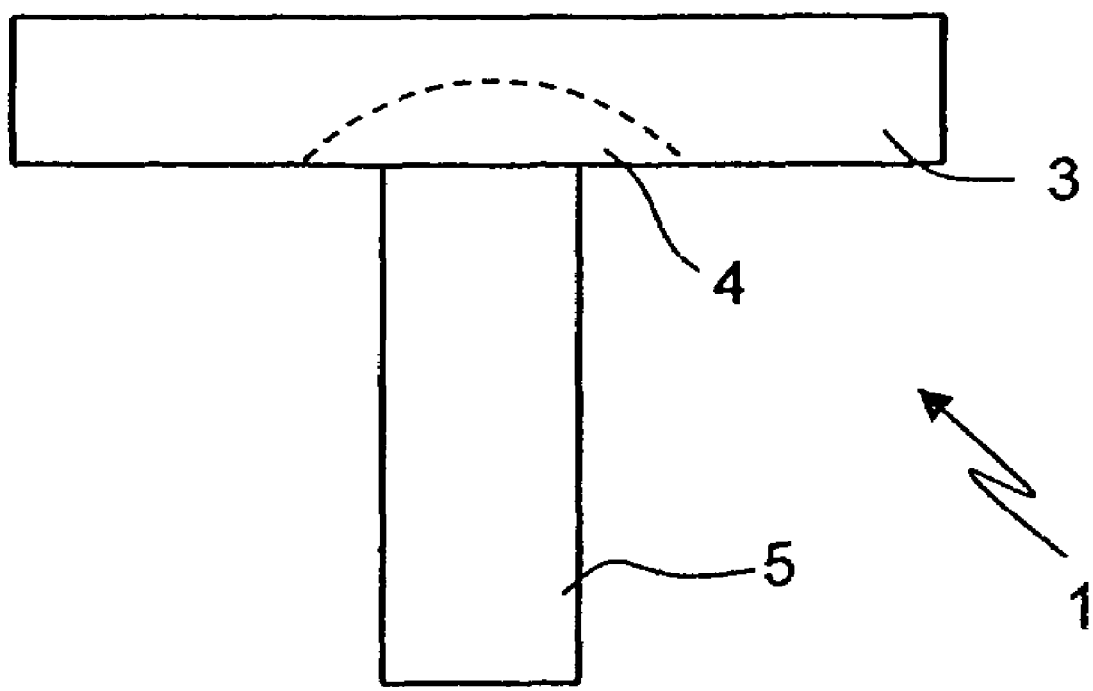
FIG. 3 shows a chalcogenic element having a resistive element comprising TiSiN thin films.

Thus, the TiSiN thin film of the present invention meets the requirements for a resistive element capable of being incorporated in a low energy device, such as a phase change memory device. A schematic structure of such a phase change memory device is shown in FIG. 3, in which a resistive element 5, comprising entirely of TiSiN, is in direct contact with a chalcogenic region 4. A process for fabricating a phase change memory device is disclosed, for example, in U.S. application Ser. No. 10/313,991, filed Dec. 5, 2002, which is incorporated herein by reference in its entirety.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is clear that numerous variations and modifications may be made to process and material described and illustrated herein, all falling within the scope of the invention as defined in the attached claims.

The invention claimed is:

1. A process for forming a film of TiSiN, comprising:
   a) depositing a TiN film;
   b) exposing the TiN film to a silicon releasing gas to obtain a TiSiN film without previously exposing the TiN film to a carbon-reducing treatment; and
   c) exposing the TiSiN film to a $H_2/N_2$ plasma, wherein the TiSiN film is exposed to the plasma at 200-800 sccm (standard cubic centimeters per minute).

2. A process according to claim 1, wherein step a) comprises thermally decomposing a metallorganic precursor.

3. A process according to claim 2, wherein step a) is carried out at 300-450° C.

4. A process according to claim 1, wherein said silicon releasing gas is silane ($SiH_4$) or dichlorosilane ($SiH_2Cl_2$).

5. A process according to claim 4, wherein step b) comprises exposing the TiN film to the silicon releasing gas for more than 10 s and less than 90 s.

6. A process according to claim 5, wherein step b) comprises exposing the TiN film for about 40 s.

7. A process according to claim 1 wherein the step of depositing a TiN film comprising thermally decomposing a metallorganic precursor selected from the group consisting of tetrakis dimethylamino titanium (TD MAT) and tetrakis diethylamino titanium (TDLAT).

8. A process for forming a film of TiSin, comprising:
a) depsiting a TiN film;
b) exposing the TiN film to a silicon releasing gas to obtain a TiSiN film without previously exposing the TiN film to a carbon-reducing treatment;
c) exposing the TiSiN film to a $H_2/N_2$ plasma, after step c):
d) annealing the TiSiN film in an inert gas environment; wherein step d) is carried out at 600-800° C.

9. A process according to claim 8, wherein step d) is carried out in an RTP (Rapid Thermal Process) equipment.

10. A process according to claim 8, comprising, after step c):
e) annealing the TiSiN film in an oxidizing gas environment.

11. A process according to claim 10, wherein step e) is carried out in an RTP equipment.

12. A process according to claim 10, wherein step e) is carried out at 500-800° C.

13. A process according to claim 8, comprising, after step d):
e) annealing the TiSiN film in an oxidizing gas environment.

14. A process according to claim 13, wherein step e) is carried out in an RTP equipment.

15. A process according to claim 13, wherein step e) is carried out at 500-800° C.

16. A process of forming a resistive film comprising:
depositing a TiN film, wherein carbon is produced;
reacting the TiN film with silicon to form a TiSiN film, wherein a portion of the carbon is replaced by silicon; and
removing a remaining portion of carbon from the TiSiN film, wherein the TiSiN film has a resistivity of higher than 0.6 mΩ·cm and Si content equals to or higher than 4.5 at %.

17. The process of claim 16 wherein the TiN film is deposited by thermally decomposing a metallorganic precursor comprising titanium, carbon and nitrogen.

18. The process of claim 17 wherein the metallorganic precursor is tetrakis dimethylamino titanium (TDMAT) or tetrakis diethylamino titanium (TDLAT).

19. The process of claim 16 wherein the silicon is produced by decomposing silane or dichlorosilane.

20. The process of claim 16 wherein the remaining portion of carbon is removed by a plasma treatment.

21. The process of claim 16 further comprising annealing the TiSiN film to form the resistive film.

* * * * *